(12) United States Patent
Dooley et al.

(10) Patent No.: US 8,323,439 B2
(45) Date of Patent: Dec. 4, 2012

(54) DEPOSITING CARBON NANOTUBES ONTO SUBSTRATE

(75) Inventors: Kevin Dooley, Blessington County (IE); Ratnesh Kumar Sharma, Fremont, CA (US); Lynn Sheehan, Barndarring County (IE); Sergio Escobar-Vargas, Santa Clara, CA (US); Anna Fenelon, Assaly (IE)

(73) Assignee: Hewlett-Packard Development Company, L.P., Houston, TX (US)

( * ) Notice: Subject to any disclaimer, the term of this patent is extended or adjusted under 35 U.S.C. 154(b) by 422 days.

(21) Appl. No.: 12/399,968

(22) Filed: Mar. 8, 2009

(65) Prior Publication Data

US 2010/0224354 A1 Sep. 9, 2010

(51) Int. Cl.
*B44C 3/08* (2006.01)
*B44C 1/16* (2006.01)
*B44C 1/24* (2006.01)
*B32B 37/02* (2006.01)
*B32B 37/14* (2006.01)
*B32B 37/26* (2006.01)
*B32B 38/10* (2006.01)
*B32B 37/16* (2006.01)
*B29C 65/48* (2006.01)

(52) U.S. Cl. ........ 156/247; 156/230; 156/234; 156/239; 156/289

(58) Field of Classification Search .................. 156/230, 156/234, 239, 247, 248, 249, 298
See application file for complete search history.

(56) References Cited

U.S. PATENT DOCUMENTS

| | | | |
|---|---|---|---|
| 4,728,535 A | 3/1988 | Joo' et al. | |
| 6,097,138 A * | 8/2000 | Nakamoto | 313/309 |
| 6,232,706 B1 * | 5/2001 | Dai et al. | 313/309 |
| 6,855,376 B2 | 2/2005 | Hwang et al. | |
| 6,866,801 B1 * | 3/2005 | Mau et al. | 264/29.1 |
| 7,060,241 B2 | 6/2006 | Glatkowski | |
| 7,109,581 B2 | 9/2006 | Dangelo et al. | |
| 7,261,852 B2 * | 8/2007 | Rinzler et al. | 264/317 |
| 7,365,100 B2 | 4/2008 | Kuper et al. | |
| 7,416,019 B2 | 8/2008 | Osiander et al. | |
| 7,682,654 B2 * | 3/2010 | Cooper et al. | 427/201 |
| 7,799,163 B1 * | 9/2010 | Mau et al. | 156/247 |
| 2005/0081983 A1 * | 4/2005 | Nakayama et al. | 156/230 |
| 2005/0126766 A1 | 6/2005 | Lee et al. | |
| 2006/0162363 A1 | 7/2006 | Sharma et al. | |

(Continued)

FOREIGN PATENT DOCUMENTS

CN 1848493 A 10/2006

(Continued)

OTHER PUBLICATIONS

Meitl et al. (2004) "Solution Casting and Transfer Printing Single-Walled Carbon Nanotube Films," Nano Lett. 4:1643-1947.*

(Continued)

*Primary Examiner* — Sonya Mazumdar (57) ABSTRACT

To deposit carbon nanotubes onto a substrate, an at least partially porous film is prepared so that a surface of the film has a layer of carbon nanotubes thereon. The film is positioned in relation to a surface of the substrate such that the surface of the film having the layer of carbon nanotubes is brought into contact with the surface of the substrate. Pressure is applied to the film to attach the film, including the layer of carbon nanotubes, to the surface of the substrate.

12 Claims, 6 Drawing Sheets

U.S. PATENT DOCUMENTS

| | | | |
|---|---|---|---|
| 2007/0154623 A1 | 7/2007 | Min et al. | |
| 2008/0038183 A1 | 2/2008 | Nakata | |
| 2008/0152870 A1 | 6/2008 | Takada et al. | |
| 2008/0210406 A1 | 9/2008 | Rini et al. | |
| 2010/0024975 A1* | 2/2010 | Hecht | 156/307.1 |
| 2010/0291473 A1* | 11/2010 | Ji et al. | 429/532 |
| 2010/0294424 A1* | 11/2010 | Hart et al. | 156/249 |

FOREIGN PATENT DOCUMENTS

| | | | |
|---|---|---|---|
| CN | 101003368 A | 7/2007 | |
| JP | 2184510 A | 7/1990 | |
| JP | 11001311 A | 6/1999 | |
| JP | 11001312 A | 6/1999 | |
| JP | 2006143562 A | 6/2006 | |
| JP | 2006335604 A | 12/2006 | |
| JP | 2007063034 A | 3/2007 | |
| JP | 1997235112 A | 9/2007 | |
| JP | 2007297277 A | 11/2007 | |
| JP | 2008189901 A | 8/2008 | |
| TW | 200637931 | 4/1994 | |
| WO | WO-2005/087979 A2 | 9/2005 | |
| WO | WO-2005082775 A1 | 9/2005 | |
| WO | WO-2006/061599 A2 | 6/2006 | |
| WO | WO-2006/120449 A1 | 11/2006 | |
| WO | WO-2007/004766 A1 | 1/2007 | |
| WO | WO-2007093725 A2 | 8/2007 | |
| WO | WO-2007/137095 A2 | 11/2007 | |

OTHER PUBLICATIONS

Tse Ka Chun, "Carbon nanotube based advanced thin interface materials for thermal management," Hong Kong University of Science & Tech., Master's Thesis, Aug. 2007.

K. Zhang et al., "Carbon nanotube thermal interface material for high-brightness light-emitting-diode cooling," Nanotechnology vol. 19, year 2008.

L. Zhu, "Controlled fabrication of aligned carbon nanotube architectures for microelectronics packaging applications," Georgia Inst. of Tech., Doctoral Thesis, Dec. 2007.

R. Furberg, "Enhanced boiling heat transfer from a novel nanodendritic micro-porous copper structure," KTH School of Ind'l Eng'g & Manag., Stockholm, Thesis, Jun. 2006.

X.H. Yan et al., "Effects of intertube coupling and tube chirality on thermal transport of carbon nanotubes," J'l of Appleid Physics, vol. 99, year 2006.

Chih-Yen Lin, "Investigation and charcterization of SWNT buckypaper manufacturing process," Florida State Univ., Master's Thesis, Summer 2005.

E. Callone et al., "A low-cost method for producing high-performance nanocomposite thin-films made from silica and CNTs on cellulose substrates," J Mat'l Sci vol. 43, year 2008.

G. Chai et al., "Mechanical properties of carbon nanotube-copper nanocomposites," J. Micromech. Microeng., vol. 18, year 2008.

Y. Chai et al., "Flexible transfer of aligned carbon nanotube films for integration at lower temperature," Nanotechnology, vol. 18, year 2007.

Z. Wu et al., "Transparent, conductive carbon nanotube films," Science vol. 35, year 2004.

J. Hone et al., "Thermal conductivity of single-walled carbon nanotubes," Physical Review B (Rapid Communications), vol. 59, year 1999.

S. Berber et al., "Unusually high thermal conductivity of carbon nanotubes," Physical Review Letters, vol. 84, year 2000.

"Thermal conductivities of the elements (data page)", Internet web site en.wikipedia.org/wiki/Thermal_conductivities_of_the_elements_(data_page), last modified Feb. 2009.

"List of thermal conductivies," Internet web site en.wikipedia.org/wiki/List_of_thermal_conductivities, last modified Mar. 2009.

Q. Ngo et al., "Thermal interface properties of Cu-filled vertically aligned carbon nanofiber arrays," Nano Letters, vol. 4, year 2004.

J.A. Dean (ed), Lange's Handbook of Chemistry (15th ed), McGraw-Hill, 1999, Section 4, Table 4.1.

* cited by examiner

DEPOSITING CARBON NANOTUBES ONTO SUBSTRATE

BACKGROUND

Electronic components of computing devices and other types of electronic devices usually generate heat during operation. To prevent damage to such electronic components, the generated heat is desirably removed from the components. One common way to remove the heat generated by electronic components is to employ heat sinks. A heat sink is thermally coupled to an electronic component, and draws the heat generated by the component away from the component. The heat sink itself may be cooled by using a gaseous or liquid fluid to exhaust the heat from the heat sink, or to otherwise mitigate this heat.

DETAILED DESCRIPTION

Statement of Problem and Overview of Solution

Figure 1:
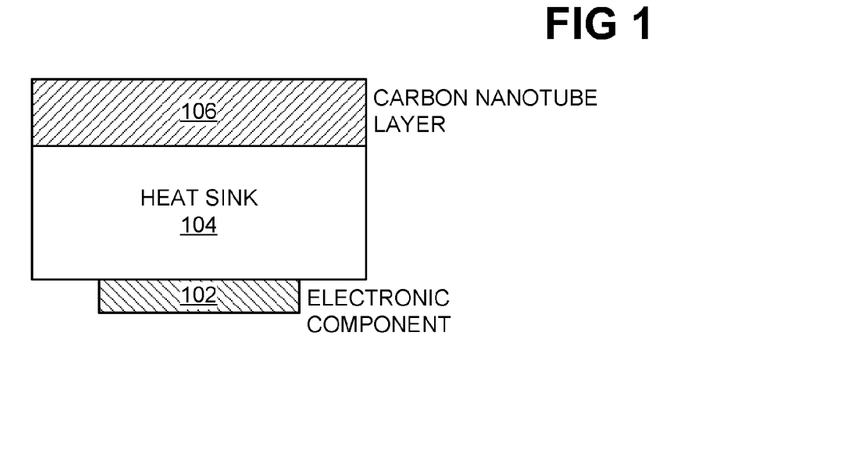
FIG. 1 is a diagram of an electronic component to which a heat sink having a carbon nanotube layer is thermally coupled, according to an embodiment of the present disclosure.

FIG. 1 shows an electronic component 102 to which a heat sink 104 having a carbon nanotube layer 106 is thermally coupled, according to an embodiment of the disclosure. The electronic component 102 may be a semiconductor device, such as an integrated circuit like a processor, or another type of electronic component. The heat sink 104 is thermally coupled to the electronic component 102. For example, thermal paste may be applied between the heat sink 104 and the electronic component 102 to adhere the heat sink 104 to the component 102. The thermal paste promotes heat transfer from the electronic component 102 to the heat sink 104.

The heat sink 104 is typically fabricated from a material that readily absorbs heat. Examples of such materials include copper and aluminum, as well as other heat-absorbing metals and other heat-absorbing materials that are not metals. The heat sink 104 has a carbon nanotube layer 106 deposited on a surface of the heat sink 104. The carbon nanotube layer 106 has been found to improve the dissipation of heat generated by the electronic component 102 using the heat sink 104, as compared to a heat sink that does not have such a carbon nanotube layer. Thus, for electronic components that generate large amounts of heat, thermally coupling heat sinks having carbon nanotube layers to such components advantageously promotes faster heat removal as compared to heat sinks that do not have carbon nanotube layers.

Depositing a carbon nanotube layer onto a heat sink can be a relatively laborious and/or expensive process, which may dampen more widespread utilization of heat sinks having carbon nanotube layers. One approach to depositing a carbon nanotube layer of sufficient thickness, such as 100-700 microns onto a heat sink to promote heat dissipation is a high-temperature process known as chemical vapor deposition (CVD). In CVD, the heat sink surface is placed in a high-temperature chamber. A carbon nanotube vapor is introduced into the chamber, which results in deposition of carbon nanotubes onto the heat sink surface. The high-temperature nature of CVD, as well as the specialized equipment needed to employ CVD, renders it a relatively cost-prohibitive process to mass produce of heat sinks having carbon nanotube layers, however.

Non-high-temperature (e.g., low-temperature, such as room-temperature) and more cost-effective solutions to depositing carbon nanotubes onto heat sinks include spray-coating and inkjet-printing. In spray-coating, a carbon nanotube solution is sprayed onto a heat sink surface to deposit a carbon nanotube layer onto the surface of the heat sink. Similarly, in inkjet-printing, a carbon nanotube solution is fluidically ejected onto a heat sink surface to deposit a carbon nanotube layer onto the surface of the heat sink, using inkjet-printing technology. However, while spray-coating and inkjet-printing are more cost-effective than CVD, they may also nevertheless be disadvantageous as ways to deposit carbon nanotubes onto a heat sink.

In particular, the thickness of a layer of carbon nanotubes that spray-coating and inkjet-printing can apply to a heat sink surface in a single pass may be relatively thin, such as 10-50 microns. To build up the carbon nanotube layer on the heat sink to a thickness that is sufficient to promote faster heat dissipation, a relatively large number of spray-coating or inkjet-printing passes may have to be performed, such as 5-10 passes. Having to perform multiple spray-coating or inkjet-printing passes can be disadvantageous, because it means that the carbon nanotube layer deposition process is relatively slow, which militates against using these processes to mass produce heat sinks having carbon nanotube layers.

The inventors have developed a novel and innovative approach to depositing carbon nanotubes onto heat sink surfaces that overcomes the issues associated with existing carbon nanotube deposition techniques that have been noted above. A brief overview of this approach is described in this section of detailed description, and a more detailed embodiment of the approach is presented in the next section of the detailed description. As such, FIG. 2 shows a general method 200 for depositing a carbon nanotube layer onto a heat sink surface, according to an embodiment of the present disclosure.

Figure 2:
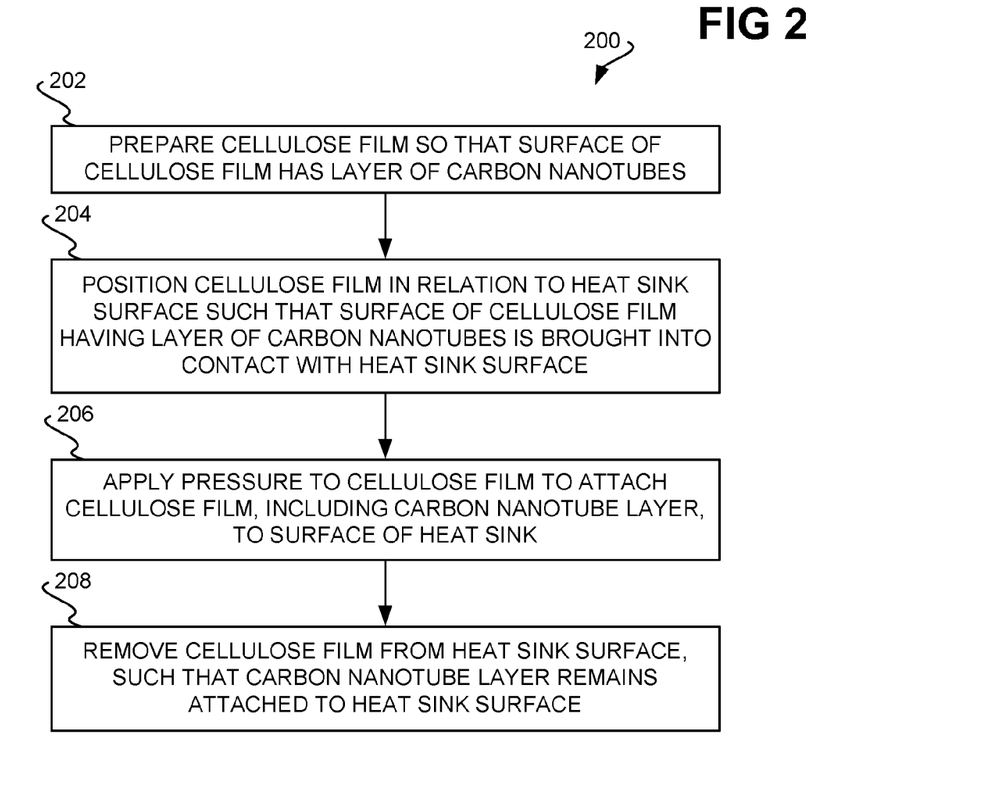
FIG. 2 is a flowchart of a general method for depositing a carbon nanotube layer onto a surface of a heat sink, according to an embodiment of the present disclosure.

The embodiment of FIG. 2, as well as other embodiments of the present disclosure, are described in particular relation to applying a carbon nanotube layer onto the surface of a heat sink. However, more generally, embodiments of the present disclosure can be employed to apply a carbon nanotube layer onto the surface of a substrate. The substrate may be a metal substrate, such as a copper substrate. In this sense, the substrate may be a heat sink in one embodiment.

A cellulose film is prepared so that a surface of the cellulose film has a layer of carbon nanotubes (202). The cellulose film is positioned in relation to a surface of the heat sink such that the surface of the cellulose film having the layer of carbon nanotubes is brought into contact with the surface of the heat sink (204). Pressure is applied to the cellulose film to attach the cellulose film, including the layer of carbon nanotubes, to the surface of the heat sink (206). The cellulose film is finally removed from the surface of the heat sink such that the layer of carbon nanotubes remains attached to the surface of the heat sink (208).

It is noted that the embodiment of FIG. 2, as well as other embodiments of the present disclosure, has been described in particular relation to a cellulose film. The cellulose film may be a cellulose acetate film or a nitrocellulose mixed ester film. In general, this film is an at least partially porous film, which permits the film to be prepared so that it has a layer of carbon nanotubes, as is described in detail in the next section of the detailed description. Other types of at least partially porous films may also be employed, however, in lieu of a cellulose acetate film. Other such types of films include polycarbonate membrane films.

The method 200 is advantageous over existing approaches to depositing carbon nanotubes onto heat sink surfaces in a number of ways. First, the method 200 is a low-temperature, such as a room-temperature, process, as compared to CVD in particular, which is a high-temperature process. As such, the inventive approach is more a cost effective way to deposit carbon nanotubes onto heat sink surfaces. Indeed, expensive equipment is unnecessary to practice the method 200, unlike when employing CVD. Therefore, the inventive approach is more conducive to mass production of heat sinks having carbon nanotube layers.

Second, the layer of carbon nanotubes attached to the surface of the heat sink in practicing the method 200 is thicker than the layer of carbon nanotubes that a single pass of carbon nanotube spray-coating or a single pass of carbon nanotube inkjet-printing can deposit on a surface of a heat sink. As such, the method 200 is performed more quickly than spray-coating or inkjet-printing. Therefore, the inventive approach is more conducive to mass production of heat sinks having carbon nanotube layers for this reason as well.

In the next section of the detailed description, the inventive approach to deposit carbon nanotubes onto heat sink surfaces is described in greater detail. The final section of the detailed description presents an exemplary use of a heat sink having a layer of carbon nanotubes, as may have been deposited on the heat sink in accordance with the inventive approach. Those of ordinary skill within the art will recognize, however, that variations can be made to the detailed approach presented in the next section of the detailed description, without departing from the spirit or scope of the present disclosure, and that heat sinks having carbon nanotube layers can be employed for uses other than that presented in the final section of the detailed description.

DETAILED EMBODIMENT OF THE PRESENT DISCLOSURE

Figure 3:
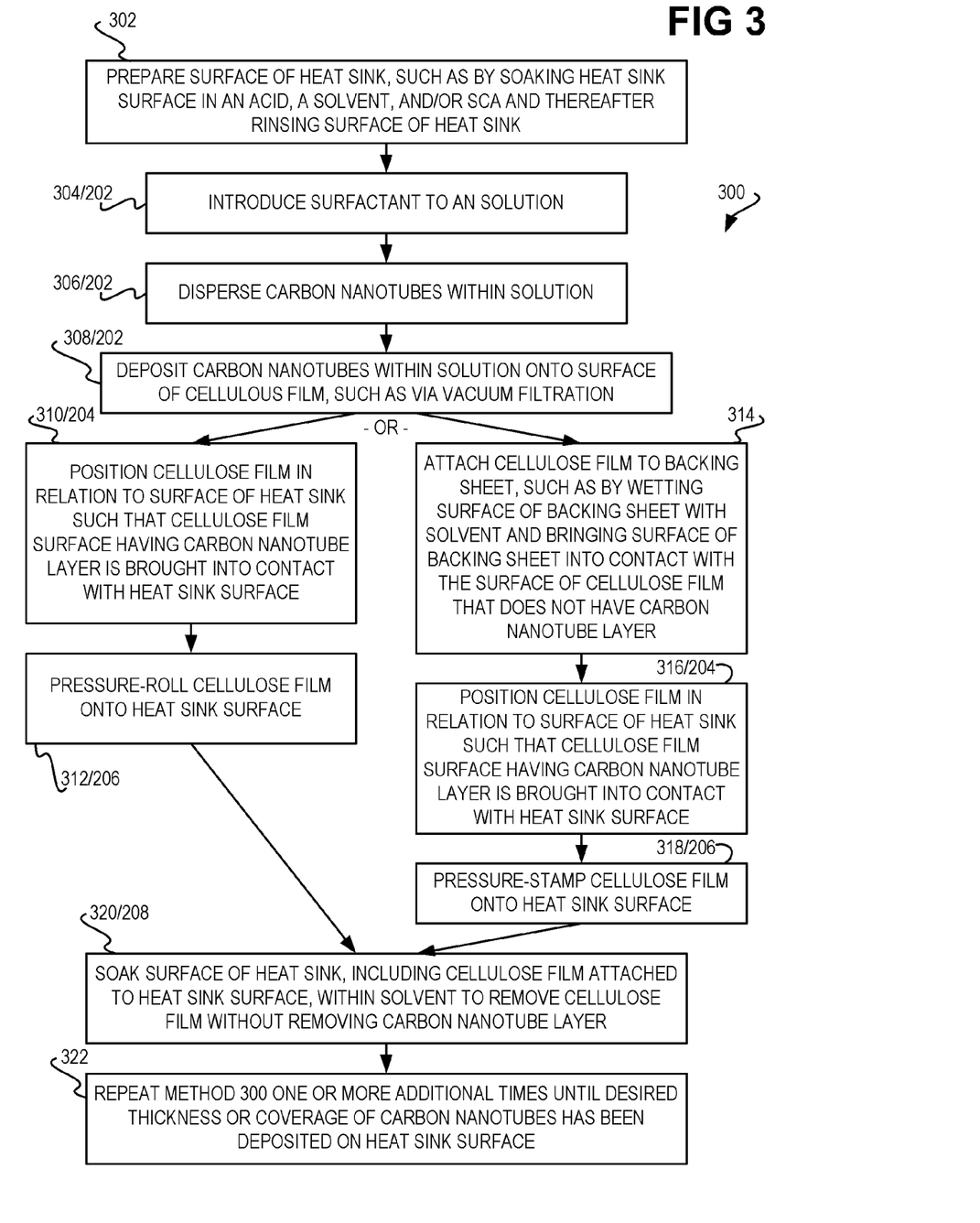
FIG. 3 is a flowchart of a method for depositing a carbon nanotube layer onto a surface of a heat sink that is more detailed than but consistent with the method of FIG. 2, according to an embodiment of the present disclosure.

FIG. 3 shows a detailed method 300 for depositing carbon nanotubes onto a heat sink surface, according to an embodiment of the disclosure that is more detailed than but consistent with the embodiment of FIG. 2. The surface of a heat sink to which carbon nanotubes are to be deposited may in one embodiment be initially prepared to promote adhesion of the subsequently applied carbon nanotube layer (302). For example, the heat sink surface in question may be soaked in an acid, a solvent, and/or a silane-coupling agent (SCA) and then rinsed to remove any residual acid, solvent, or SCA from the heat sink surface. The acid may be hydrochloric acid, sulfuric acid, or nitric acid. Application of the acid removes any oxide build-up on the heat sink surface where the heat sink is a metal like copper. The SCA is an adhesion promoter that can be employed to improve adhesion of the subsequently applied carbon nanotube layer to the heat sink surface.

Figure 4A:
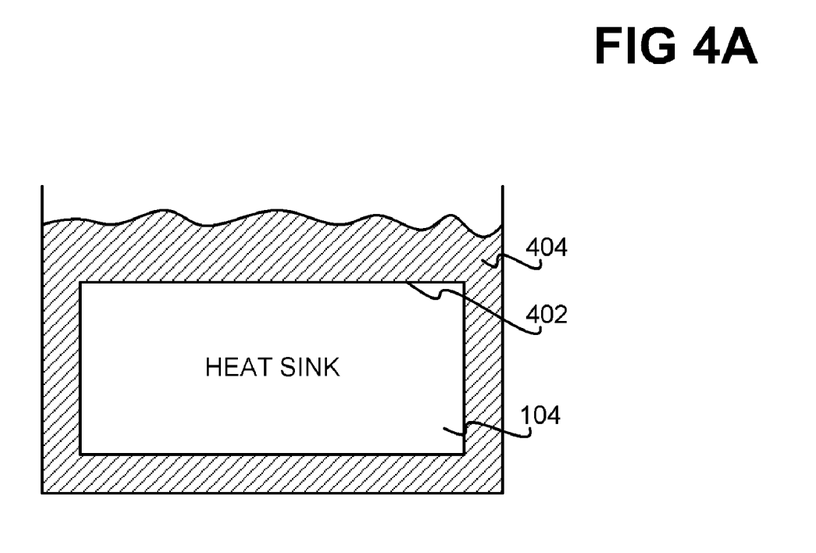
FIGS. 4A and 4B are diagrams illustratively depicting preparation of a heat sink surface to promote adhesion of a subsequently applied carbon nanotube layer to the heat sink surface, according to an embodiment of the present disclosure.
Figure 4B:
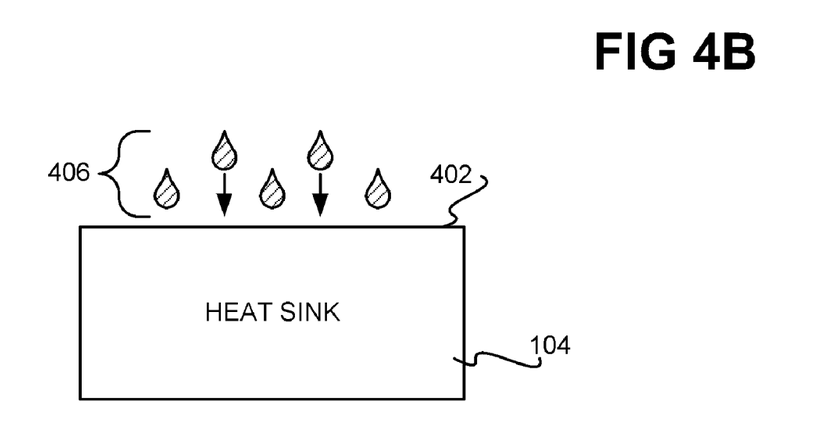

FIGS. 4A and 4B illustratively depict one performance of part 302 of the method 300, according to an embodiment of the present disclosure. The heat sink 104 has a surface 402 to which a carbon nanotube layer is to be applied. The heat sink surface 402 may be initially cleaned with deionized water having ozone (DI03), such as for twenty minutes. Thereafter, as depicted in FIG. 4A, the heat sink 104 is immersed or soaked within a fluid 404, such as for twenty minutes. The fluid 404 may be an acid, such as a 10% sulfuric acid solution; a solvent, such as n-methylpyrrolidone (NMP), which is also an acid; and/or SCA. As depicted in FIG. 4B, the heat sink surface 402 is then rinsed with a fluid 406, such as deionized water.

The purpose of preparing the heat sink surface 402 using an acid, such as sulfuric acid, is to remove any oxide layer that has formed on the surface 402. Such an oxide layer may have particularly formed on the heat sink surface 402 where the heat sink 104 is copper. It has also been discovered that carbon nanotubes appear to have an affinity with the solvent NMP, which is why the heat sink surface 402 may be prepared using NMP. Finally, it is known that preparing a surface with SCA can improve subsequent carbon nanotube adhesion to the surface.

Referring back to FIG. 3, a cellulose film is prepared so that a surface of the cellulose film has a layer of carbon nanotubes thereon by performing parts 304, 306, and 308 of the method 300. These parts are indicated as 304/202, 306/202, and 308/202 in FIG. 3 to denote that they implement part 202 of the method 200 of FIG. 2 in one embodiment of the disclosure. A surfactant is introduced to a solution (304). Carbon nanotubes are dispersed within the solution (306). Finally, the carbon nanotubes as dispersed within the solution are deposited onto a surface of a cellulose film, such as via filtration (308).

Figure 5A:
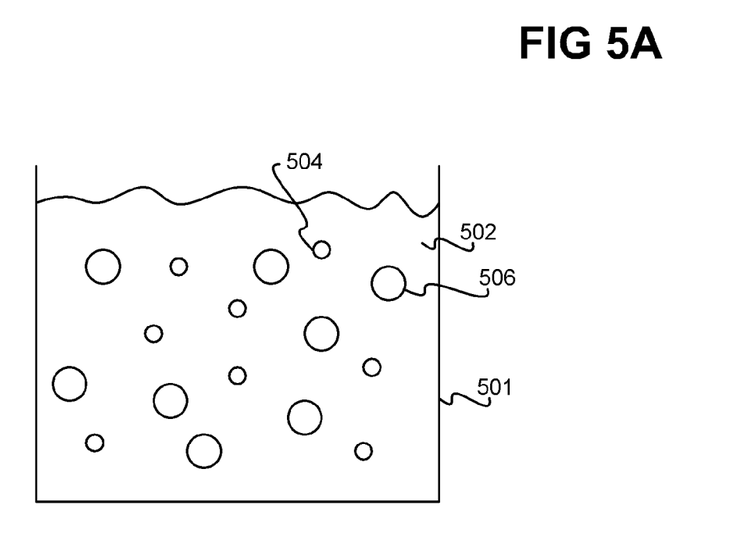
FIGS. 5A and 5B are diagrams illustratively depicting preparation of a cellulose film so that a surface of the cellulose film has a layer of carbon nanotubes, according to an embodiment of the present disclosure.
Figure 5B:
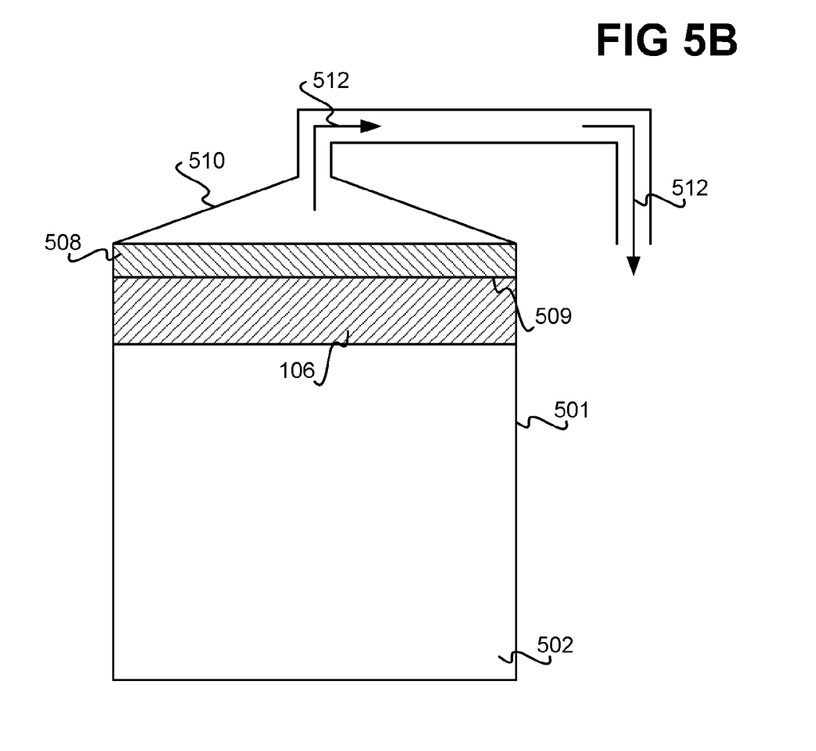

FIGS. 5A and 5B illustratively depict performance of parts 304, 306, and 308 of the method 300, according to an embodiment of the present disclosure. In FIG. 5A, a surfactant, such as sodium dodecyl sulfate (SDS), is introduced into a solution 502 contained within a container 501, which may have deionized water or n-methylpyrrolidone (NMP) as its solvent. The surfactant is denoted in FIG. 5A as small circles 504. Carbon nanotubes are dispersed with the solution 502 as well, which are denoted in FIG. 5A as large circles 506. In one embodiment, the weight of the carbon nanotubes relative to the solution 502 is 0.01%.

In FIG. 5B, a cellulose film 508 is positioned over the container 501 to cover the container 501. A vacuum filtration mechanism 510 is positioned over the cellulose film 508. By operating the vacuum filtration mechanism 510, the solution 502 is vacuumed, or suctioned, through the cellulose film 508, as denoted by arrow 512. Such vacuum filtration results in a layer of carbon nanotubes 106 being deposited onto a surface 509 of the cellulose film 508. In one embodiment, the carbon nanotube layer 106 has a thickness of approximately five microns.

A thicker carbon nanotube layer can be achieved by increasing the weight of the carbon nanotubes relative to the solution 502 in FIG. 5A, by increasing the thickness of the cellulose film 508 in FIG. 5B, or by increasing the volume of the solution 502 that is suctioned through the cellulose film 508. It is further noted that the surfactant is introduced in FIG. 5A to lower the surface tension of the solution 502, which aids in deposition of the carbon nanotubes onto the cellulose film surface 509 as the layer 106 in FIG. 5B. Approaches other than vacuum filtration may alternatively be employed to deposit the carbon nanotube layer 106 onto the surface 509 of the cellulose film 508 in FIG. 5B.

Referring back to FIG. 3, following performance of parts 304, 306, and 308 of the method 300, either parts 310 and 312 are performed, or parts 314, 316, and 318 are performed. Part 310 is indicated as part 310/204, and part 312 is indicated as part 312/206, in FIG. 3 to denote that they implement parts 204 and 206, respectively, of the method 200 of FIG. 2 in one embodiment of the disclosure. Similarly, part 316 is indicated as part 316/204, and part 318 is indicated as part 318/206, in FIG. 3 to denote that they implement parts 204 and 206, respectively, of the method 200 in one embodiment of the disclosure.

In one embodiment, then, to attach or adhere the cellulose film having the carbon nanotube layer to a heat sink surface, the cellulose film is first positioned in relation to the heat sink surface such that the cellulose film surface having the carbon nanotube layer is brought into contact with the heat sink surface (310). The cellulose film is then pressure-rolled onto the heat sink surface (312). The result is that the cellulose film, including the carbon nanotube layer, is attached to the heat sink surface in question.

Figure 6A:
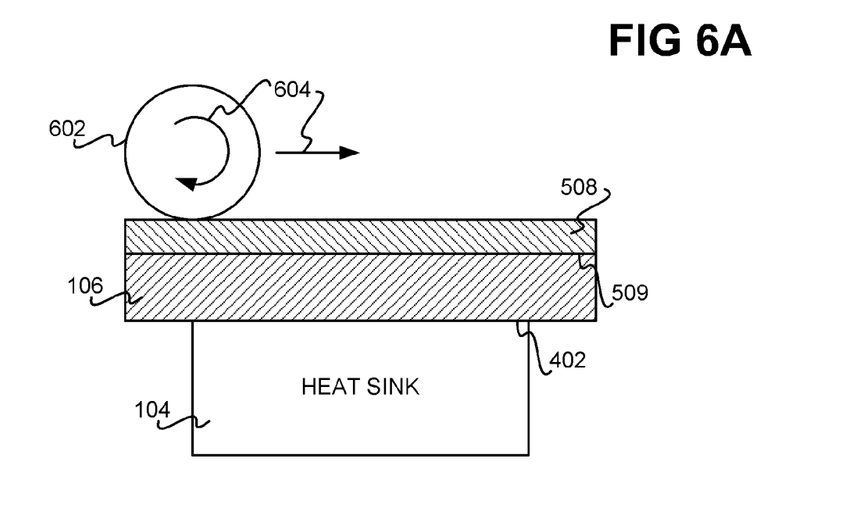
FIGS. 6A and 6B are diagrams illustratively depicting applying pressure to a cellulose film to attach the cellulose film, including a layer of carbon nanotubes, to a heat sink surface, according to different embodiments of the present disclosure.

FIG. 6A illustratively depicts performance of parts 310 and 312 of the method 300, according to an embodiment of the present disclosure. The cellulose film 508 is positioned in relation to the surface 402 of the heat sink 104 so that the cellulose film surface 509 having the carbon nanotube layer 106 is brought into contact with the heat sink surface 402. A pressure roller 602 is rolled across the cellulose film 508, as indicated by arrows 604. As such, the cellulose film 508, including the carbon nanotube layer 106, is attached to or is adhered to the heat sink surface 402. Instead of a pressure roller 602, a weight or a clamp may be employed to apply pressure across the cellulose film 508.

Referring back to FIG. 3, in another embodiment, to attach or adhere the cellulose film having the carbon nanotube layer to a heat sink surface, the cellulose film is first removably attached to a backing sheet (314). For instance, a surface of the backing sheet may be wetted with a solvent, such as acetone, and brought into contact with the surface of the cellulose film that does not have the carbon nanotube layer. The cellulose film is then positioned in relation to a heat sink surface such that the cellulose film surface having the carbon nanotube layer is brought into contact with the heat sink surface (316). The cellulose film is finally pressure-stamped onto the heat sink surface (318), to attach or adhere the cellulose film, including the carbon nanotube layer, to the heat sink surface in question. After pressure-stamping, the backing sheet is peeled off, while the cellulose film including the carbon nanotube layer remains on the heat sink surface.

Figure 6B:
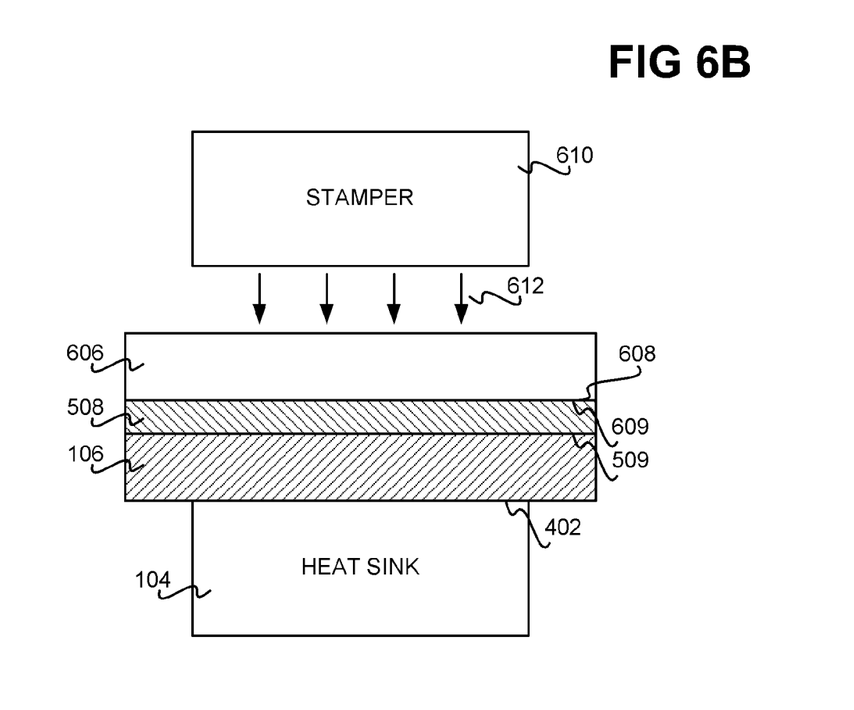

FIG. 6B illustratively depicts performance of parts 314, 316, and 318 of the method 300, according to an embodiment of the present disclosure. A surface 609 of a backing sheet 606 has been wetted with a solvent and brought into contact with the surface 609 of the cellulose film 508 that does not have the carbon nanotube layer 106. It is noted that the cellulose film surface 609 is opposite the cellulose film surface 509 that has the carbon nanotube layer 106. The backing sheet 606 thus becomes removably attached to the cellulose film 508.

The cellulose film 508 is positioned in relation to the surface 402 of the heat sink 104 such that the cellulose film surface 509 having the carbon nanotube layer 106 is brought into contact with the heat sink surface 402. A pressure stamper 610 is exerted against the backing sheet 606, as indicated by arrows 612, to attach or adhere the cellulose film 508, including the carbon nanotube layer 106, to the heat sink surface 402. During this pressure-stamping, the cellulose film 106 becomes removed from the backing sheet 606. The purpose of the backing sheet 606 is to protect the cellulose film 508 from the stamper 610 during pressure-stamping.

Referring back to FIG. 3, following performance of parts 310 and 312 or parts 314, 316, and 318, part 320 of the method 300 is performed. Part 320 is indicated as part 320/208 to denote that this part implements part 208 of the method 200 of FIG. 2 in one embodiment of the disclosure. The surface of the heat sink, including the cellulose film attached to this heat sink surface, is soaked within a solvent to remove the cellulose film from the heat sink surface without removing the carbon nanotube layer from the surface (320).

Figure 7:
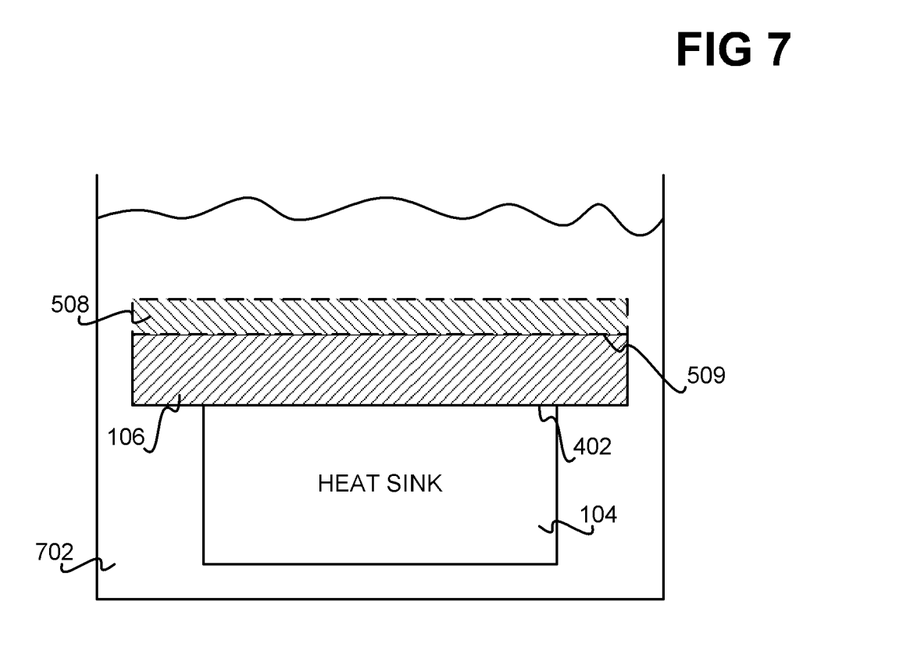
FIG. 7 is a diagram illustratively depicting removal of a cellulose film previously attached to a heat sink surface, where a carbon nanotube layer deposited on the cellulose film remains attached to the heat sink surface, according to an embodiment of the present disclosure.

FIG. 7 illustratively depicts performance of part 320 of the method 300, according to an embodiment of the present disclosure. The heat sink 104, including the surface 402 to which the cellulose film 508 having the carbon nanotube layer 106 on the surface 509 thereof has been attached, is soaked or immersed within a solvent 702. The solvent 702 may be acetone. The heat sink 104 may be soaked within the solvent 702 for twenty minutes in one embodiment, followed by a soaking within fresh solvent for another twenty minutes in another embodiment. Thereafter, the heat sink 104 may be rinsed, such as with deionized water, to remove any residual solvent.

Soaking the heat sink 104 within the solvent 702 one or two times removes the cellulose film 508 without removing the carbon nanotube layer 106 from the heat sink surface 402. The cellulose film 508 is indicated in FIG. 7 in dashed or dotted lines to denote that it is being removed due to immersion within the solvent 702. Thus, the end result is that the heat sink 104 has the carbon nanotube layer 106 attached to the heat sink surface 402. It is noted that the entirety of the method 300 can be performed in a low-temperature, such as a room-temperature, environment.

It is noted that performance of part 320 of the method 300 of FIG. 3, as illustratively depicted in FIG. 7, can occur after the heat sink 104 has been transported. As such, the cellulose film 508 can act as a protective layer protecting the carbon nanotube layer 106 on the heat sink 104 during transportation. Once the heat sink 104 has been transported to the location at which it is to be attached to the electric component 102, the cellulose film 508 may then be removed as has been described.

Referring back to FIG. 3, following performance of part 320 of the method 300, the method 300 may be repeated one or more additional times until the desired thickness or coverage of carbon nanotubes has been deposited on the heat sink surface in question (322). For example, the method 300 may be repeated beginning at part 304 if additional carbon nanotube solution is needed, or part 308 if there is still remaining carbon nanotube solution following earlier performance of parts 304 and 306. In some embodiments, however, the method 300 is not repeated, and is performed just once to achieve a desired thickness and coverage of carbon nanotubes onto the heat sink surface. Repetition is typically performed where the carbon nanotube layer on the heat sink surface is of desired thickness in most locations on the heat sink surface, but where coverage of the carbon nanotube layer is not completely uniform over the entire heat sink surface.

Alternatively, rather than repeating the method 300 one or more additional times to increase the thickness of the carbon nanotube layer on the heat sink surface until the desired thickness is achieved, other approaches may be employed so that the desired thickness is achieved in a single pass of the method 300. For example, as noted above, the weight of the carbon nanotubes relative to the solution 502 may be increased in FIG. 5A so that the desired thickness of carbon nanotubes on the heat sink surface is achieved. As another example, as also noted above, the thickness of the cellulose film 508 may be increased in FIG. 5B so that the desired thickness of carbon nanotubes on the heat sink surface is achieved. As a third example, as also noted above, the volume of the solution 502 that is suctioned through the cellulose film 508 in FIG. 5B may be increased so that the desired thickness of carbon nanotubes on the heat sink surface is achieved.

Exemplary Use of a Heat Sink Having a Carbon Nanotube Layer

Figure 8:
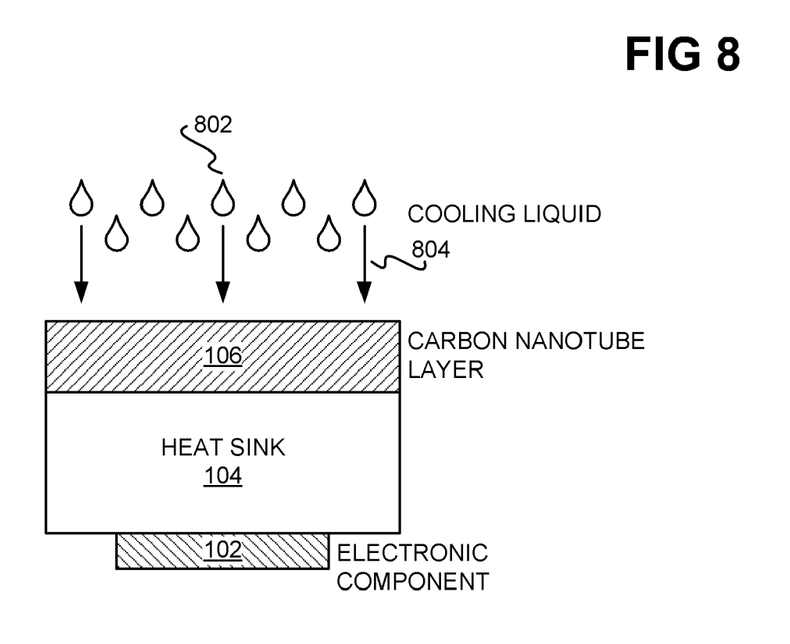
FIG. 8 is a diagram illustratively depicting a method for cooling an electronic component by spraying a cooling liquid onto a heat sink surface having a carbon nanotube layer, according to an embodiment of the present disclosure.

FIG. 8 shows an exemplary use or application of a heat sink having a carbon nanotube layer, according to an embodiment of the disclosure. In particular, FIG. 8 illustratively depicts a method for cooling the electronic component 102. The electronic component 102 is thermally coupled to the heat sink 104, which has the carbon nanotube layer 106 deposited thereon as has been described in the preceding sections of the detailed description. The method illustratively depicted in FIG. 8 includes spraying a cooling liquid 802 onto the surface of the heat sink 104 having the carbon nanotube layer 106, as indicated by arrows 804. The cooling liquid 802 may be water, such as deionized water, or another type of cooling liquid.

The carbon nanotube layer 106 has a larger surface area than the surface of the heat sink 104 onto which the layer 106 has been deposited. This is due to the nature of carbon nanotubes in general. The heat sink 104 has a flat, smooth surface in FIG. 8, with little pitting or holes to increase its surface area. By comparison, the carbon nanotube layer 106 does not have a smooth surface, but rather has many interstices, crevices, holes, and so on, to provide it with a relatively large surface area. The large surface area of the carbon nanotube layer 106 promotes greater dissipation of heat generated by the electronic component 102 upon the cooling liquid 802 being sprayed onto the surface of the heat sink 104, as compared to if the carbon nanotube layer 106 were absent.

Furthermore, the porosity of the carbon nanotube layer 106 promotes penetration of the cooling liquid 802 into the layer 106, which also provides for faster cooling than if the carbon nanotube layer 106 had not been deposited on the surface of the heat sink 104. The porosity of the carbon nanotube layer 106 also inhibits splashing of the cooling liquid 802 sprayed onto the surface of the heat sink 104 and promotes trapping of the liquid 802, to provide for faster cooling than if the carbon nanotube layer 106 had not been deposited on the surface of the heat sink 104. Thus, the carbon nanotube layer 106 provides for better cooling of the electronic component 102 in the method illustratively depicted in FIG. 8, in which a cooling liquid is sprayed onto a surface of the heat sink 104 thermally coupled to the electronic component 102.

In one embodiment of the spray-cooling application depicted in FIG. 8, the thickness of the carbon nanotube layer 106 on the heat sink 104 is between 100 and 1,000 microns in thickness. Having a thickness of less than 1,000 microns ensures that the carbon nanotube layer 106 is saturated with the cooling liquid 802 during spray-cooling to ensure proper nucleate boiling. The carbon nanotubes within the carbon nanotube layer 106 act as heat sink fins due to the porosity of the carbon nanotubes, such that the exterior surface of the heat sink on which the layer 106 is applied is at least substantially flat. Furthermore, in general, application of the carbon nanotube layer 106 onto the heat sink 104 permits a wider variety of materials to be used as heat sinks, where ordinarily such materials would be less tolerant to thermal stresses.

Finally, the carbon nanotube layer 106 in spray-cooling applications, such as that depicted in FIG. 8, desirably has a density optimal to the spray-cooling application in question. A carbon nanotube density that is too high can result in the cooling liquid 802 being unable to fill interstices of the carbon nanotube layer 106 and the resulting vapor of the cooling liquid 802 being unable to escape from the layer 106. By comparison, a carbon nanotube density that is too low can result in pooling of the cooling liquid 802 within the carbon nanotube layer 106, which can decrease cooling performance.

We claim:

1. A method for depositing carbon nanotubes onto a substrate, comprising:
    preparing an at least partially porous film so that a surface of the at least partially porous film has a layer of carbon nanotubes thereon;
    removably attaching the at least partially porous film to a backing sheet;
    after removably attaching the at least partially porous film to the backing sheet, positioning the at least partially porous film in relation to a surface of the substrate such that the surface of the at least partially porous film having the layer of carbon nanotubes is brought into contact with the surface of the substrate; and,
    applying pressure to the at least partially porous film to attach the at least partially porous film, including the layer of carbon nanotubes, to the surface of the substrate.

2. The method of claim 1, wherein preparing the at least partially porous film comprises:
    dispersing a plurality of carbon nanotubes within a solution; and,
    depositing the carbon nanotubes within the solution onto the surface of the at least partially porous film.

3. The method of claim 2, wherein preparing the at least partially porous film further comprises introducing a surfactant to the solution prior to dispersing the carbon nanotubes within the solution.

4. The method of claim 2, wherein depositing the carbon nanotubes within the solution onto the surface of the at least partially porous film comprises employing vacuum filtration.

5. The method of claim 1, wherein applying pressure to the at least partially porous film comprises one of pressure-rolling, weighting, and clamping the at least partially porous film onto the surface of the substrate.

6. The method of claim 1,
    wherein applying pressure to the at least partially porous film comprises pressure-stamping the at least partially porous film onto the substrate via the backing sheet.

7. The method of claim 1, wherein attaching the at least partially porous film to the backing sheet comprises:
    wetting a surface of the backing sheet with a solvent; and,
    bringing the surface of the backing sheet into contact with a second surface of the at least partially porous film such that the second surface of the at least partially porous film adheres to the surface of the backing sheet, wherein the second surface of the at least partially porous film is opposite the surface of the at least partially porous film having the layer of carbon nanotubes.

8. The method of claim 1, further comprising removing the at least partially porous film from the surface of the substrate such that the layer of carbon nanotubes remains attached to the surface of the substrate.

9. The method of claim 8, wherein removing the at least partially porous film from the surface of the substrate such that the layer of carbon nanotubes remains attached to the surface of the substrate comprises soaking the surface of the substrate, including the at least partially porous film attached to the surface of the substrate, within a solvent.

10. The method of claim 1, further comprising preparing the surface of the substrate to promote adhesion of the layer of carbon nanotubes thereto, prior to positioning the at least partially porous film in relation to the surface of the substrate.

11. The method of claim 10, wherein preparing the surface of the substrate comprises:
　soaking the surface of the substrate in one or more of an acid, a solvent, and a silane-coupling agent (SCA); and,
　rinsing the surface of the substrate to remove any residual acid, solvent, or SCA from the surface of the substrate.

12. A method for depositing carbon nanotubes onto a heat sink, comprising:
　dispersing a plurality of carbon nanotubes within a solution;
　vacuum filtrating the carbon nanotubes through a cellulose film to apply the carbon nanotubes as a layer onto a surface of the cellulose film;
　positioning the cellulose film in relation to a surface of the heat sink such that the surface of the cellulose film having the layer of carbon nanotubes is brought into contact with the surface of the heat sink;
　attaching the cellulose film, including the layer of carbon nanotubes, to the surface of the heat sink by one of:
　　pressure-rolling, weighting, or clamping the cellulose film onto the surface of the heat sink;
　　pressure-stamping the cellulose film as previously removably attached to a backing sheet onto the surface of the heat sink via the backing sheet;
　soaking the surface of the heat sink, including the cellulose film attached to the surface of the heat sink, within a solvent to remove the cellulose film from the surface of the heat sink such that the layer of carbon nanotubes remains attached to the surface of the heat sink.

\* \* \* \* \*